United States Patent [19]
Zomorrodi

[11] Patent Number: 5,959,475
[45] Date of Patent: Sep. 28, 1999

[54] COMPLEMENTARY PUSH-PULL CMOS SOURCE FOLLOWER ANALOG VIDEO BUFFER

[75] Inventor: Mehrdad Zomorrodi, West Hills, Calif.

[73] Assignee: Xerox Corporation, Stamford, Conn.

[21] Appl. No.: 09/006,253

[22] Filed: Jan. 13, 1998

[51] Int. Cl.$^6$ .............................. H03K 17/16; H03F 3/30; H03F 3/16

[52] U.S. Cl. ........................... 327/112; 327/73; 327/391; 327/437; 330/253; 330/255; 330/260

[58] Field of Search .................................... 327/111, 112, 327/384, 387, 391, 437, 72, 73; 330/253, 255, 259, 260; 326/26, 85, 86

[56] References Cited

U.S. PATENT DOCUMENTS

| | | | |
|---|---|---|---|
| 4,021,751 | 5/1977 | Suzuki | 330/253 |
| 4,366,442 | 12/1982 | Yamada | 330/254 |
| 4,730,168 | 3/1988 | Senderowicz et al. | 330/253 |
| 4,963,837 | 10/1990 | Dedic | 330/253 |
| 5,081,536 | 1/1992 | Tandon et al. | 358/213.31 G |
| 5,166,635 | 11/1992 | Shih | 330/253 |
| 5,206,544 | 4/1993 | Chen et al. | 326/30 |
| 5,361,041 | 11/1994 | Lish | 330/255 |
| 5,463,240 | 10/1995 | Watanabe | 257/369 |
| 5,596,289 | 1/1997 | Liu | 330/260 |
| 5,805,005 | 9/1998 | Raisinghani et al. | 327/333 |
| 5,821,776 | 10/1998 | McGowan | 326/41 |

OTHER PUBLICATIONS

G. Caiulo, F. Maloberti, G. Palmisano and S. Portaluri, Video CMOS Power Buffer with Extended Linearity, IEEE Journal of Solid State Circuits, vol. 28, Jul. 1993, pp. 845–848.

K. Nagaraj, Large Swing CMOS Buffer Amplifier, IEEE Journal of Solid–State Circuits, vol. 24, No. 1, Feb. 1989, pp. 181–183.

Joseph N. Babanezhad, A Rail–to–Rail CMOS Op Amp, IEEE Journal of Solid–State Circuits, vol. 23, No. 6, Dec. 1988, pp. 1414–1417.

Laszlo Moldovan and Hua Harry Li, A Rail–to–Rail, Constant Gain, Buffered Op–Amp for Real Time Video Applications, IEEE Journal of Solid–State Circuits, vol. 32, No. 2, Feb. 1997, pp. 169–176.

Primary Examiner—Timothy P. Callahan
Assistant Examiner—Terry L. Englund
Attorney, Agent, or Firm—Fariba Rad

[57] ABSTRACT

An analog video buffer utilizes a complementary push-pull CMOS source follower video buffer with a feedback driver. The CMOS source follower provides a low impedance output node with high driving capabilities, high switching speed, and rail-to-rail linearity and the feedback driver isolates the output node from the feedback needed for the design of the video buffer to provide a transient response without ringing or overshoot.

8 Claims, 3 Drawing Sheets

FIG. 1 (PRIOR ART)
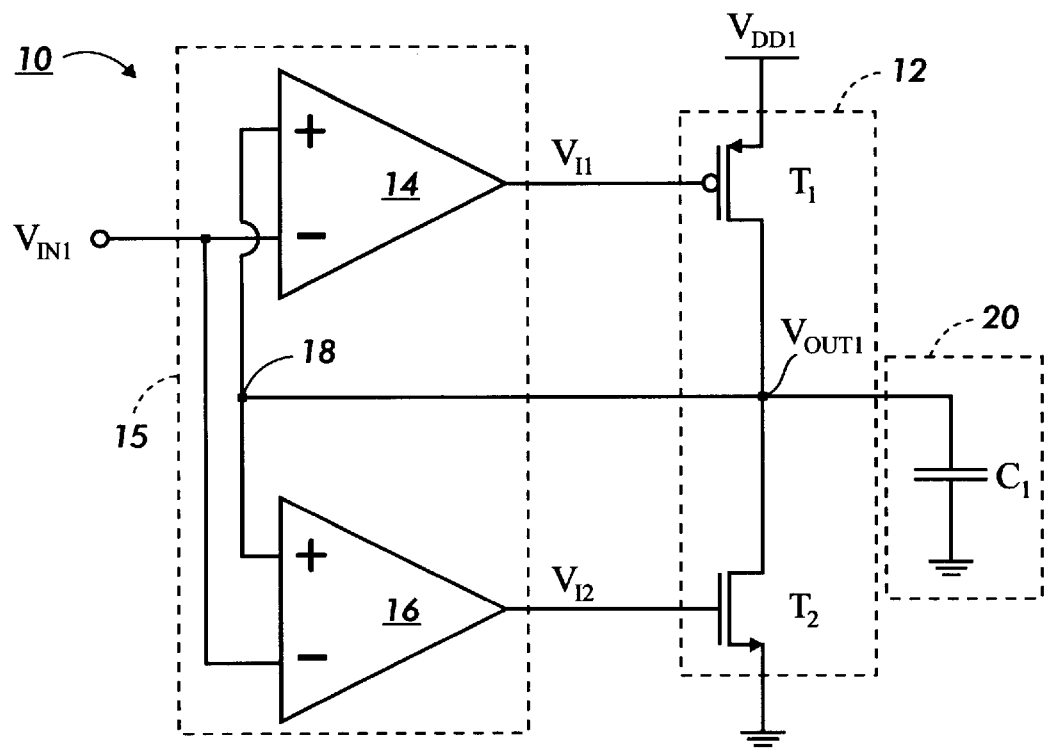
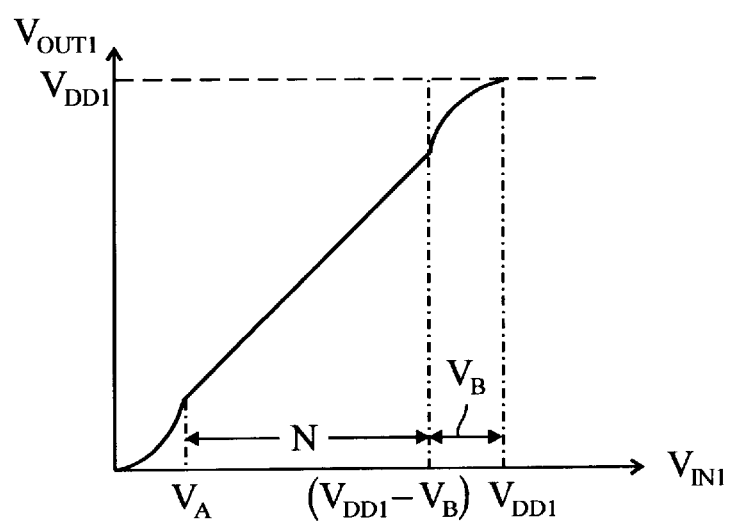
FIG. 2 (PRIOR ART)

COMPLEMENTARY PUSH-PULL CMOS SOURCE FOLLOWER ANALOG VIDEO BUFFER

BACKGROUND OF THE INVENTION

This Application is related to a video buffer of a sensor array imager and more particularly to an analog video buffer which utilizes a complementary push-pull source follower driver to provide a rail-to-rail linearity, high speed, high gain and low power consumption.

A sensor array is an imager for an image input terminal of a digital copier or scanner. Any sensor array has an array of photosensing diodes to convert an image into analog signals. Based on the resolution of digital copiers which are typically in the range of 400–600 pixels per inch, a sensor array utilizes one photosensing diode for each pixel. For example, a sensor array can have (600 pixel per inch)×(12 inches)= 7200 diodes to cover all the pixels of a 12 inch line with 600 pixels per inch resolution.

Once a sensor array is exposed to an illuminated document, each one of the diodes generates an analog signal based on the amount of the received light. The signal that each diode generates is the information (data) of its respective pixel. Each signal from each diode is sent into a signal processing circuit and subsequently transferred onto a data bus through a buffering stage. The buffering stage requires an analog video buffer to place the analog data onto the bus. For the purpose of simplicity, hereinafter, the "analog video buffer" is referred as "video buffers".

A video buffer for a sensor array imager of a digital copier needs to have certain characteristics. It has to have high driving capabilities to provide high switching speed. In a digital copier, due to the high number of photosensing diodes (i.e. 7200 diodes), the data bus has a high capacitance which is the sum of all the capacitances of all the video buffers and other circuits connected to the bus. Thus, the video buffer has to be able to drive the bus. In addition, the video buffer has to have a transient response with no ringing or overshoot to produce a high quality image. The next characteristics of a video buffer is a low power consumption. Since each diode of a sensor array has a video buffer and the number of diodes in a sensor array is large, the cumulative power consumption of the video buffers is high. Therefore, it is critical to design the video buffers to have low power consumption. Finally, a video buffer has to be linear to prevent any signal distortion which affects the quality of the image.

Typically, a sensor array imager utilizes a video buffer with a push-pull driver or a source follower driver. Referring to FIG. 1, there is shown a prior art video buffer 10 with a push-pull driver 12. The push-pull driver 12 comprises two complementary symmetry metal oxide silicon (CMOS) field effect transistors $T_1$ and $T_2$. Transistor $T_1$ is a P-channel (PMOS) transistor and transistor $T_2$ is an N-channel (NMOS) transistor. The source of transistor $T_1$ is connected to a power supply $V_{DD1}$ and the source of transistor $T_2$ is grounded. The drains of both transistors $T_1$ and $T_2$ are connected to each other at the output node $V_{OUT1}$. The output node $V_{OUT1}$ is connected to a data bus 20 which is represented by the bus capacitance $C_1$.

The video buffer 10 further comprises an input stage 15 with two differential input amplifiers 14 and 16. The gate of transistor $T_1$ is connected to the output terminal of the differential input amplifier 14 and the gate of transistor $T_2$ is connected to the output terminal of the differential input amplifier 16. In order to properly drive the transistors $T_1$ and $T_2$ of the driver 12, the differential input amplifiers 14 and 16 must have matching characteristics to provide compatible signals and therefore must have the same type of MOS transistors as transistors $T_1$ and $T_2$.

The non-inverting input terminals (+) of the differential input amplifiers 14 and 16 are connected to each other at node 18 and the inverting input terminals (−) are connected to each other and also to an input voltage $V_{IN1}$. In addition, the output node $V_{OUT1}$ is connected to node 18. The differential input amplifiers 14 and 16 provide input voltages $V_{I1}$ and $V_{I2}$ to the transistors $T_1$ and $T_2$ respectively. The two signals $V_{I1}$ and $V_{I2}$ have the same phase. However, depending on the levels of the $V_{I1}$ and $V_{I2}$, either $T_1$ or $T_2$ will take over.

Usually, the drain of any MOSFET transistor has a high impedance. Since the output node $V_{OUT1}$ is connected to both drains of transistors $T_1$ and $T_2$, the output node has a high impedance. The high impedance of the output node provides a high gain which is desirable. However, high impedance in conjunction with the large capacitance $C_1$ of the bus and other dominant pole frequencies of the video buffer will cause an oscillation. Typically, this oscillation is observed as an overshoot or ringing on the output signal. In order to reduce the oscillation and stabilize the circuit, compensation circuitry needs to be added to the video buffer output which reduces the speed.

The video buffer 10 is highly linear. However, its linearity is not rail-to-rail. Referring to FIG. 2, there is shown the linearity graph of the video buffer 10 of FIG. 1. The horizontal axis represents the input voltage $V_{IN1}$ and the vertical axis represents the output voltage $V_{OUT1}$.

Referring to both FIGS. 1 and 2, $V_{IN1}$ changes within a range from 0–5 volts known as rail-to-rail where levels 0 and 5 volts define the rails of power supply range. In addition, the voltage of the output node $V_{OUT1}$ follows the input voltage $V_{IN1}$. When $V_{IN1}$ approaches either rail of the power supply range, since the output voltage $V_{OUT1}$ follows $V_{IN1}$, the drain to source voltage $V_{DS}$ of either $T_2$ or $T_1$ will decrease depending on if $V_{IN1}$ is close to 0 or 5 volts respectively. If $V_{IN1}$ decreases to a level below $V_A$, $V_{DS2}$ also decreases to a level below $V_A$. $V_A$ is a voltage at the output node $V_{OUT1}$ which depends on the size and the characteristics of transistor $T_2$. Once $V_{DS2}$ decreases to a voltage value below the value of $V_A$, $V_{I2}$ adjusts itself to match $V_{DS2}$ and transistor $T_2$ enters into the ohmic (triode) region in which the linearity is distorted.

In the same manner, if $V_{IN1}$ increases to a level above $V_{DD1}-V_B$, $V_{DS1}$ decreases to a voltage value below the value of $V_B$. $V_B$ is a voltage at the output node $V_{OUT1}$ which depends on the size and the characteristics of transistor $T_1$. Once $V_{DS1}$ decreases to a voltage value below the value of $V_B$, $V_{I1}$ adjusts itself to match $V_{DS1}$ and transistor $T_1$ enters into the ohmic (triode) region in which the linearity is distorted. Therefore, since the video buffer 10 is linear only between $V_A$ and $V_{DD1}-V_B$, it does not have a full range rail-to rail (0–5 volts) linearity.

The advantage of this circuit is its low power consumption. It is well know that CMOS circuits have a low power consumption. Therefore, the video buffer 10 has a lower power consumption as opposed to a source follower video buffer with two NMOS transistors.

In summary, the video buffer 10 has a low power consumption, but low speed and limited range of linearity. Since in an imager sensor array, the speed and stability of switching is extremely critical, the video buffer 10 is not a proper buffer for a high speed imager sensor array.

Referring to FIG. 3, there is shown a video buffer 30 with a source follower driver 32. In FIG. 3, an NMOS transistor $T_3$ is used in a source follower configuration. The drain of transistor $T_3$ is connected to a power supply $V_{DD2}$, its source is connected to the drain of an NMOS transistor $T_4$ at node $V_{OUT2}$ and its gate is connected to the output terminal of a differential input amplifier 36. Transistor $T_4$, which is used as an active load, has its gate connected to a bias voltage $V_{BIAS}$ and its source grounded. The output node $V_{OUT2}$ is connected to a data bus 34 which is represented by the bus capacitance $C_2$ and to the inverting input (−) of the differential input amplifier 36. The non-inverting input terminal (+) of the differential input amplifier 36 is connected to an input voltage $V_{IN2}$. The differential input amplifier 36 provides an input voltage $V_{I3}$ to transistor $T_3$.

Typically, the source of any transistor is the lowest impedance node of the transistor. Therefore, in the video buffer 30, since the output node $V_{OUT2}$ is connected to the source of transistor $T_3$ and to the drain of transistor $T_4$, the video buffer 30 has an average impedance. Thus, this video buffer provides a high speed.

However, the video buffer 30 has a limited range of linearity. Referring to both FIGS. 3 and 4, there is shown a linearity graph of the video buffer 30. The horizontal axis represents the input voltage $V_{IN2}$ and the vertical axis represents the output voltage $V_{OUT2}$. In FIG. 4, if the input voltage is between 0 and $V_C$, transistor $T_3$ is not completely On. $V_C$ depends on the size and characteristics of the transistor $T_4$. Once the input voltage $V_{I3}$ reaches $V_C$, the output voltage $V_{OUT2}$ becomes linear and stays substantially linear for the input voltage between $V_C$ and $V_{DD2}$. Therefore, the video buffer 30 is linear only for the limited range of $V_C$ to $V_{DD2}$. In addition, this circuit has a high power consumption due to having two NMOS transistors which carry dc current all the time.

SUMMARY OF THE INVENTION

Accordingly, it is an object of this invention to provide an analog video buffer which has high driving capabilities, high switching speed, low power consumption, a transient response with no ringing or overshoot, and rail-to-rail linearity.

In carrying out the above, there is disclosed an analog video buffer which utilizes a driver and an input stage. The driver of the analog video buffer of this invention comprises a CMOS source follower in which an NMOS transistor and a PMOS transistor are connected to each other through their sources at an output node.

In accordance with another aspect of this invention, there is disclosed an analog video buffer which utilizes a driver, a feedback driver and an input stage. The driver of the analog video buffer of this invention comprises a CMOS source follower. The feedback means has a feedback node and the input means has a feedback receiving node which are connected to each other. The driver means has an output node which is isolated from the feedback node.

BRIEF DESCRIPTION OF THE DRAWINGS

FIG. 1 shows a prior art video buffer with a push-pull driver;

FIG. 2 shows a linearity graph of the video buffer of FIG. 1;

DETAILED DESCRIPTION OF THE INVENTION

Figure 3:
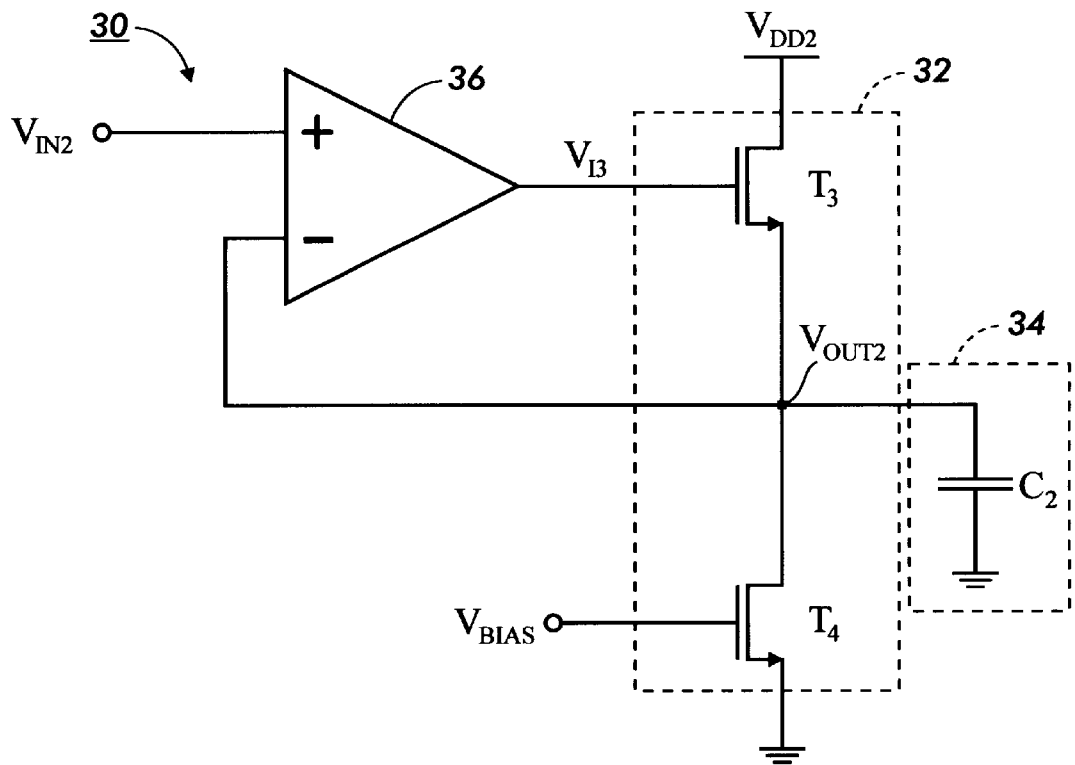
FIG. 3 shows a prior art video buffer with a source follower.
Figure 4:
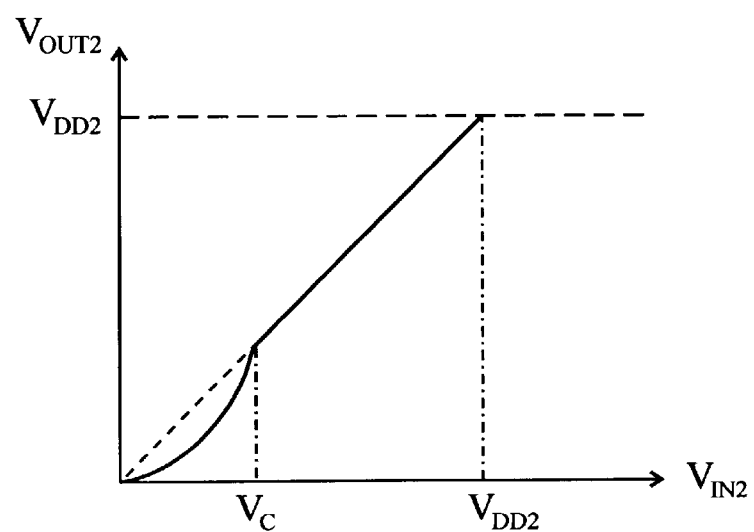
FIG. 4 shows a linearity graph of the video buffer of FIG. 3.
Figure 5:
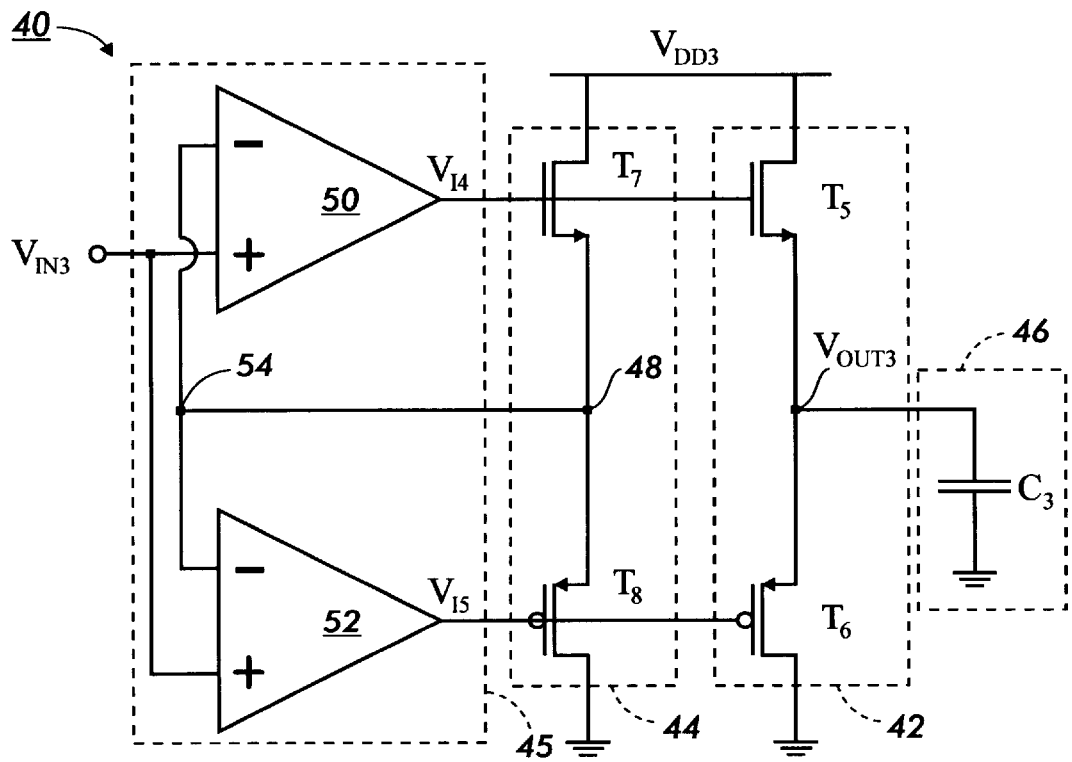
FIG. 5 shows a video buffer of this invention.

Referring to FIG. 5, there is shown a video buffer 40 of this invention. The video buffer 40 comprises a CMOS driver 42, a CMOS feedback driver 44, and an input stage 45. The driver 42 comprises an NMOS transistor $T_5$ and a PMOS transistor $T_6$ which are used in a bidirectional push-pull CMOS source follower configuration.

Contrary to the common knowledge of connecting the drains of two transistors of a push-pull driver, in this invention, the two sources of two transistors $T_5$ and $T_6$ are connected to each other at the output node $V_{OUT3}$. The drain of transistor $T_5$ is connected to a power supply $V_{DD3}$ and the drain of transistor $T_6$ is grounded. The output node $V_{OUT3}$ is connected to a data bus 46 which is represented by the bus capacitance $C_3$.

The feedback driver 44, which has a similar design to the design of the driver 42, comprises an NMOS transistor $T_7$ and a PMOS transistor $T_8$. Again, the drain of transistor $T_7$ is connected to the power supply $V_{DD3}$ and the drain of transistor $T_8$ is grounded. The sources of both transistors $T_7$ and $T_8$ are connected to each other at node 48. $T_7$ and $T_8$ can be scaled down to much smaller sizes than $T_5$ and $T_6$, but keep the same aspect ratio.

The input stage 45 comprises two differential input amplifiers 50 and 52. The non-inverting input terminals (+) of the differential input amplifiers 50 and 52 are connected to each other and to an input voltage $V_{IN3}$ and the inverting input terminals (−) are connected to each other at node 54. The gates of transistors $T_5$ and $T_7$ are connected to each other and to the output terminal of the differential input amplifier 50 and the gates of transistors $T_6$ and $T_8$ are connected to each other and to the output terminal of differential input amplifier 52.

In order to properly drive the transistors $T_5$ and $T_6$ of the driver 42, the differential input amplifiers 50 and 52 must have matching characteristics to provide compatible signals and therefore must have the same type of MOS transistors as transistors $T_5$ and $T_6$. Thus, the differential input amplifier 50 must have NMOS differential input transistors and the differential input amplifier 52 must have PMOS differential input transistors.

The differential input amplifier 50 provides an input voltage $V_{I4}$ to the gates of both transistors $T_5$ and $T_7$ and the differential input amplifier 52 provides an input voltage $V_{I5}$ to the gates of transistors $T_6$ and $T_8$. The two signals $V_{I4}$ and $V_{I5}$ have the same phase. However, depending on the levels of $V_{I4}$ and $V_{I5}$, either $T_5$ or $T_6$ will take over.

In this configuration, since the source of a transistor is its lowest impedance node, the output node $V_{OUT3}$ has a much lower impedance than a push-pull video buffer and therefore is more stable and faster than a push-pull video buffer of FIG. 2.

In addition, to further increase the speed, the video buffer of this invention is designed in two stages of driver 42 and feedback driver 44. The feedback driver 44 is added to the driver 42 to further isolate the output node $V_{OUT3}$ from the feedback connection of the video buffer 40. Typically, in a conventional video buffer such as the video buffer 10 of FIG. 1, the output node $V_{OUT1}$ is connected to node 18 of the input stage 15 to create a dominant pole for feedback. On the contrary, in the video buffer 40, node 48 (feedback node) of the feedback driver 44 is connected to node 54 (feedback receiving node) of the input stage 45 to create a dominant pole for feedback.

Figure 6:
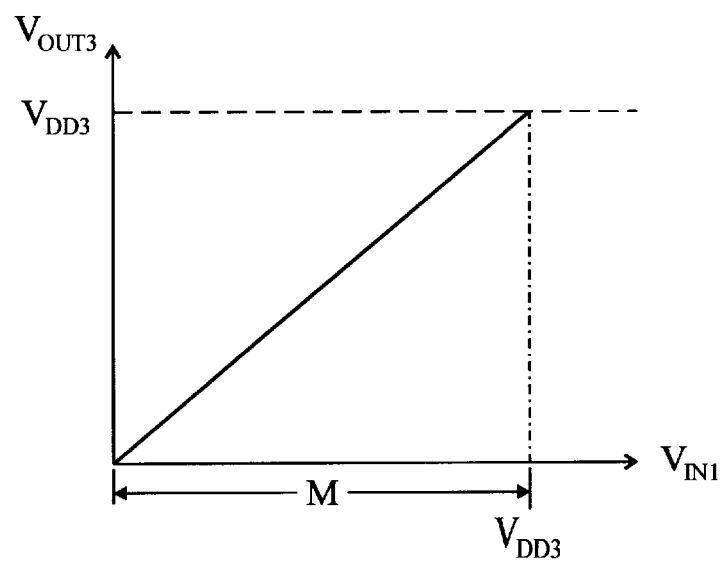
FIG. 6 shows a linearity graph of the video buffer of FIG. 5.

Also, the video buffer 40 has a rail-to-rail range of linearity. Referring to FIG. 6, there is shown a graph of the linearity of the video buffer 40 of this invention. The horizontal axis represents the input voltage $V_{IN3}$ and the vertical axis represents the output voltage $V_{OUT3}$. When $V_{IN3}$ changes, since the output voltage $V_{OUT3}$ follows $V_{IN3}$, the drain to source voltages $V_{DS5}$ and $V_{DS6}$ of either $T_5$ or $T_6$ will change and therefore $V_{I4}$ and $V_{I5}$ adjust themselves to match $V_{DS5}$ and $V_{DS6}$.

In FIG. 6, both transistors $T_5$ and $T_6$ are ON for any value of the input voltage $V_{IN3}$ between 0–5 volts. In the lower portion of range M (0–5 volts), transistor $T_5$ takes over and transistor $T_6$ acts as an active load and in the upper portion of the range M, transistor $T_6$ takes over and transistor $T_5$ acts as an active load. Therefore, the video buffer 40 has a rail-to-rail linearity.

Furthermore, since the driver 42 and the feedback driver 44 are CMOS, with a proper design of the differential input amplifiers 50 and 52, the power consumption of the video buffer 40 is low. In summary, the video buffer 40 of this invention has high driving capabilities which provides high switching speed, rail-to-rail linearity, high stability and low power consumption. The above characteristics allow the video buffer of this invention to be used in sensor array imager of a digital copier or scanner.

It should be noted that in the video buffer 40 of this invention, the feedback driver 44 is used to enhance the performance of the driver stage 42. However, if one desires, the feedback driver 44 can be eliminated and the video buffer 40 can be used without the feedback driver 44. In that case the output node $V_{OUT3}$ has to be connected to node 54 to provide the necessary feedback.

It should be noted that numerous changes in details of construction and the combination and arrangement of elements may be resorted to without departing from the true spirit and scope of the invention as hereinafter claimed.

I claim:

1. An analog video buffer comprising:
   an input means having an NMOS differential input amplifier, a PMOS differential input amplifier, a feedback receiving node and an input node for receiving an input signal to said video buffer;
   said NMOS differential input amplifier and said PMOS differential input amplifier each having an inverting input, a non-inverting input, and an output;
   said non-inverting inputs of said NMOS and PMOS differential input amplifiers being electrically connected to said input node of said input means and said inverting inputs of said NMOS and PMOS differential input amplifiers being electrically connected to each other at said feedback receiving node of said input means;
   a feedback means having a feedback node;
   said feedback means being electrically connected to said input means and being responsive to said input means;
   said feedback node of said feedback means being electrically connected to said feedback receiving node of said input means;
   a driver means having an output node for sending out an output signal from said analog video buffer;
   said driver means being electrically connected to said input means and said feedback means and being responsive to said input means; and
   said driver means and said feedback means being so constructed and arranged relative to each other that said output node is isolated from said feedback node.

2. The analog video buffer recited in claim 1, wherein said driver means is a CMOS driver.

3. The analog video buffer recited in claim 2, wherein said CMOS driver comprises a first NMOS transistor and a first PMOS transistor being connected to each other through their sources at said output node.

4. The analog video buffer recited in claim 3, wherein said feedback means is a CMOS feedback driver.

5. The analog video buffer recited in claim 4, wherein said CMOS feedback driver comprises a second NMOS transistor and a second PMOS transistor being connected to each other through their sources at said feedback node.

6. The analog video buffer recited in claim 5, wherein said output of said NMOS differential amplifier is electrically connected to said respective gate of said first and said second NMOS transistors, said output of said PMOS differential amplifier is electrically connected to said respective gate of said first and said second PMOS transistors.

7. An analog video buffer comprising:
   a first NMOS transistor having a source, a drain, and a gate;
   a first PMOS transistor having a source, a drain, and a gate;
   said first NMOS transistor and said PMOS transistor being electrically connected to each other through their sources at an output node;
   said drain of said first NMOS transistor being electrically connected to a power supply;
   said drain of said first PMOS transistor being grounded;
   an input means having an NMOS differential input amplifier, a PMOS differential input amplifier, a feedback receiving node and an input node for receiving an input signal to said video buffer;
   said NMOS differential input amplifier and said PMOS differential input amplifier each having an inverting input, a non-inverting input, and an output;
   said non-inverting inputs of said NMOS and PMOS differential input amplifiers being electrically connected to said input node of said input means and said inverting inputs of said NMOS and PMOS differential input amplifiers being electrically connected to each other at said feedback receiving node of said input means;
   said gate of said first NMOS transistor being electrically connected to said output of said NMOS differential input amplifier;
   said gate of said first PMOS transistor being electrically connected to said output of said PMOS differential input amplifier; and said analog video buffer being so constructed and arranged that said output node is isolated from said feedback receiving node.

8. The analog video buffer recited in claim 7 wherein said analog video buffer further comprising:
   a second NMOS transistor having a source, a drain, and a gate;
   a second PMOS transistor having a source, a drain, and a gate;
   said second NMOS transistor and said second PMOS transistor being connected to each other through their sources at a feedback node;

said drain of said second NMOS transistor being connected to the power supply;

said drain of said second PMOS transistor being grounded;

said gate of said second NMOS transistor being electrically connected to said gate of said first NMOS transistor and to said output of said NMOS differential input amplifier;

said gate of said second PMOS transistor being electrically connected to said gate of said first PMOS transistor and to said output of said PMOS differential input amplifier; and said feedback node being electrically connected to said feedback receiving node of said input means.

* * * * *